(12) United States Patent  (10) Patent No.: US 6,996,755 B2
Kawarazaki  (45) Date of Patent: Feb. 7, 2006

(54) SQUENCE CONTROL CIRCUIT

(75) Inventor: Futoshi Kawarazaki, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 858 days.

(21) Appl. No.: 09/816,338

(22) Filed: Mar. 26, 2001

(65) Prior Publication Data
US 2001/0027516 A1    Oct. 4, 2001

(30) Foreign Application Priority Data
Mar. 30, 2000    (JP) .......................... P2000-095916

(51) Int. Cl.
*G01R 31/28*    (2006.01)
*G06F 15/00*    (2006.01)

(52) U.S. Cl. .................................... 714/724; 712/245

(58) Field of Classification Search ................ 712/234, 712/241, 245, 248, 226, 233, 243; 714/718, 714/724
See application file for complete search history.

(56) References Cited

U.S. PATENT DOCUMENTS 5,615,218 A  *  3/1997  Tsurumi ..................... 714/743
6,421,773 B1 *  7/2002  Inagaki ....................... 712/234

* cited by examiner

*Primary Examiner*—Albert Decady
*Assistant Examiner*—Cynthia Britt
(74) *Attorney, Agent, or Firm*—Thelen Reid & Priest LLP

(57) ABSTRACT

A sequence control circuit that is capable of operating at high-speed without using either a memory having a short access time or high-speed devices is provided. Each address of an instruction memory includes an instruction next to the current instruction designated by a program counter signal and an instruction of the jump target of the current instruction. Instruction registers receive instructions from the instruction memory to output those in the next cycle. A selector selects either one of the outputs from the instruction registers depending on a jump signal. A program counter control section decodes an instruction from the selector to determine the next program counter signal and a jump signal. An address register receives the next program counter signal to output an instruction memory address in the next cycle. A jump register receives the jump signal to output that to the selector in the next cycle.

13 Claims, 7 Drawing Sheets

10 (PROGRAM COUNTER CONTROL SECTION)

| INSTRUCTION MEMORY ADDRESS | STORAGE AREA FOR SEQUENCE CONTROL INSTRUCTION ON NEXT LINE | STORAGE AREA FOR SEQUENCE CONTROL INSTRUCTION CONTAINED IN JUMP TARGET LINE |
|---|---|---|
| 0 | LOOP 3 AA | INDEFINITE |
| 1 | NOOP | LOOP 3 AA |
| 2 | ⋮ | INDEFINITE |
| ⋮ | ⋮ | ⋮ |

FIG. 7

| PROGRAM COUNTER | SEQUENCE CONTROL INSTRUCTION | PATTERN GENERATING INSTRUCTION |
|---|---|---|
| 0 | NOOP | X=0 |
| 1 | AA: LOOP 3 AA | X=X+1 |
| 2 | NOOP | X=0 |
| ⋮ | ⋮ | |

FIG. 8

| | | |
|---|---|---|
| a | PROGRAM COUNTER SIGNAL | ⟩―0―⟨―1―⟨―1―⟨―1―⟨―2―⟨ ········ |
| k | PATTERN GENERATING INSTRUCTION | ⟩―X=0―⟨―X=X+1―⟨―X=X+1―⟨―X=X+1―⟨―X=0―⟨ ········ |
| l | PATTERN OUTPUT | ⟩―0―⟨―1―⟨―2―⟨―3―⟨―0―⟨ ········ |

SQUENCE CONTROL CIRCUIT

BACKGROUND OF THE INVENTION

1. Field of the Invention

The present invention relates to a sequence control circuit used in a semiconductor testing apparatus for testing integrated circuits (hereafter referred to as "ICs") such as semiconductor memory devices.

2. Description of the Related Art

A conventional semiconductor testing apparatus, which generates test patterns supplied to ICs under test in accordance with a test program, employs a sequence control circuit for controlling the sequence of execution of pattern generating instructions.

FIG. 6 shows the structure of a conventional semiconductor testing apparatus. This semiconductor testing apparatus is comprised of a sequence control circuit 100 which controls the sequence of execution of pattern generating instructions described in a test program, an instruction memory 200 which stores the pattern generating instructions, a pattern generating circuit 300 which is capable of carrying out computations such as addition and subtraction, and a comparator 400 which determines the quality of an IC under test 500.

The sequence control circuit 100 generates a program counter signal "a" in accordance with a sequence control instruction described in the test program. The sequence control circuit 100 accesses to the instruction memory 200 by means of the program counter signal "a" as a memory address, so that the instruction memory 200 outputs a pattern generating instruction k. The pattern generating circuit 300 generates a test pattern 1 supplied to the IC under test 500 and an expectation pattern m. The IC under test 500 operates in accordance with the test pattern 1 to generate an output signal n. The comparator 400 compares the expectation pattern m sent from the pattern generating circuit 300 with the output signal n sent from the IC under test 500 to determine the quality of the IC under test 500.

FIG. 7 shows an example of a partial test program for the semiconductor testing apparatus. This test program is comprised of groups of the value of a program counter, a sequence control instruction, and a pattern generating instruction. When a sequence control instruction NOOP is executed, the pattern generating instruction that is described in the line containing this NOOP instruction is executed and the count value of the program counter is increased. On the other hand, when a sequence control instruction LOOP is executed, the program counter is updated so as to jump to the address specified by the LOOP instruction, provided that instructions that are included in the range starting from the line specified by the LOOP instruction and ending with the line containing the LOOP instruction has not been executed as many as the specified number of times. In the example shown in FIG. 7, the specified number of times is "3" and the specified line is that labeled "AA". Further, the line specified by the label AA is identical to that containing the LOOP instruction, so that the pattern generating instruction X≈X+1 contained in this line will be executed three times.

The operation of the conventional semiconductor testing apparatus will be explained with reference to the timing chart shown in FIG. 8 for the case that the apparatus executes the test program shown in FIG. 7.

The instruction memory 200 stores an instruction X=0 at address "0", an instruction X=X+1 at address "1", and an instruction X=0 at address "2". Once a test is started, the sequence control circuit 100 generates the values of "0", "1", "1", "1", and "2" sequentially as a sequence of the program counter signals "a" in accordance with sequence instructions described in the test program. The instruction memory 200 receives the program counter signals "a" sequentially to generate instructions X=0, X=X+1, X=X+1, X=X+1, and X=0 as the pattern generating instructions k. The pattern generating circuit 300 receives the pattern generating instructions k, and performs computation in accordance with the received instructions to generate the values of "0", "1", "2", "3", and "0" as the test pattern 1.

The test pattern 1 thus generated is supplied to the IC under test 500. The comparator 400 compares the expectation pattern m, which is generated in line with the test pattern 1, with the sequence of the output signals n sent from the IC under test 500 to determine the quality of the IC under test 500.

Next, the structure of a conventional sequence control circuit 100 will be explained with reference to FIG. 9. The sequence control circuit 100 is comprised of an instruction memory 21 which stores sequence control instructions, a program counter control section 11, and a register 1.

The instruction memory 21 is accessed in accordance with the program counter signal "a" sent from the register 1 to generate a sequence control instruction f. The program counter control section 11 decodes the sequence control instruction f to determine the next program counter signal g (i.e. the program counter signal used in the next clock cycle). In the following clock cycle, the register 1 outputs the next program counter signal g as the program counter signal "a", so that the similar operations are carried out as in the preceding clock cycle. By repeatedly performing the series of operations described above, the sequence control circuit 100 generates the program counter signals "a" one after another.

Next, the operation of the conventional sequence control circuit 100 will be explained for the case that the sequence control circuit 100 executes the test program shown in FIG. 7. FIG. 10 shows the waveforms of various signals generated in the sequence control circuit 100 during the execution of the test program.

Prior to the start of a test, in the instruction memory 21, an NOOP instruction is written into address "0", a LOOP instruction is written into address "1", and an NOOP instruction is written into address "2". Additionally, an initial value "0" is set in the register 1. When the test is started, address "0" of the instruction memory 21 is accessed in accordance with the program counter signal "a" containing the value "0", thus the instruction memory 21 outputs an NOOP instruction as a sequence control instruction f.

The program counter control section 11 decodes the sequence control instruction NOOP, and increases the count value of the program counter to output the increased value "1" as the next program counter signal g. In the following clock cycle, the register 1 outputs the value "1", so that the similar operations will be performed as in the preceding clock cycle. The sequence control circuit 100 repeats the series of operations described above to generate the values of "0", "1", "1", "1", and "2" as a sequence of the program counter signal "a".

In the above-described conventional sequence control circuit 100, access to the instruction memory 21 and the control relating to the program counter are carried out within a single clock cycle. Therefore, the maximum speed of operation of the sequence control circuit 100 is determined by the sum of the access time of the instruction memory 21 and the time that is necessary for the operation of the program counter control section 11 and is dependant on its speed. For this reason, there is a problem in that an instruction memory 21 having a shorter access time is required for faster operation and faster devices are indispensable for constituting the program counter control section 11.

SUMMARY OF THE INVENTION

It is therefore an object of the present invention to provide a sequence control circuit that is capable of operating at high-speed, without using either a memory having a short access time or a program counter control section composed of high-speed devices.

In order to overcome the above-described problem, a sequence control circuit according to the present invention comprises: a program counter control section which decodes a sequence control instruction that is executed in the n-th cycle to output a program counter signal in the (n+1)th cycle as an instruction memory address for specifying a sequence control instruction that will be executed in the (n+1)th cycle; and an instruction memory section which outputs the sequence control instruction executed in the (n+1)th cycle to the program counter control section in the (n+1)th cycle based on a program counter signal for specifying the sequence control instruction that is executed in the n-th cycle.

Accordingly, the maximum speed of operation of the sequence control circuit is determined by either the access time of the instruction memory or the speed of operation of the program counter control section. Therefore, it is possible to realize a sequence control circuit that is capable of operating at higher speed without using either a memory having a shorter access time or high-speed devices for constituting the program counter control section.

BRIEF DESCRIPTION OF THE DRAWINGS

FIG. 7 is an explanatory diagram showing an example of a test program for the semiconductor testing apparatus.

FIG. 8 is a timing chart to explain the operation of the semiconductor testing apparatus shown in FIG. 7.

DETAILED DESCRIPTION OF THE PREFERRED EMBODIMENTS

Hereafter, embodiments of the present invention will be explained with reference to the drawings.

Embodiment 1

Figure 1:
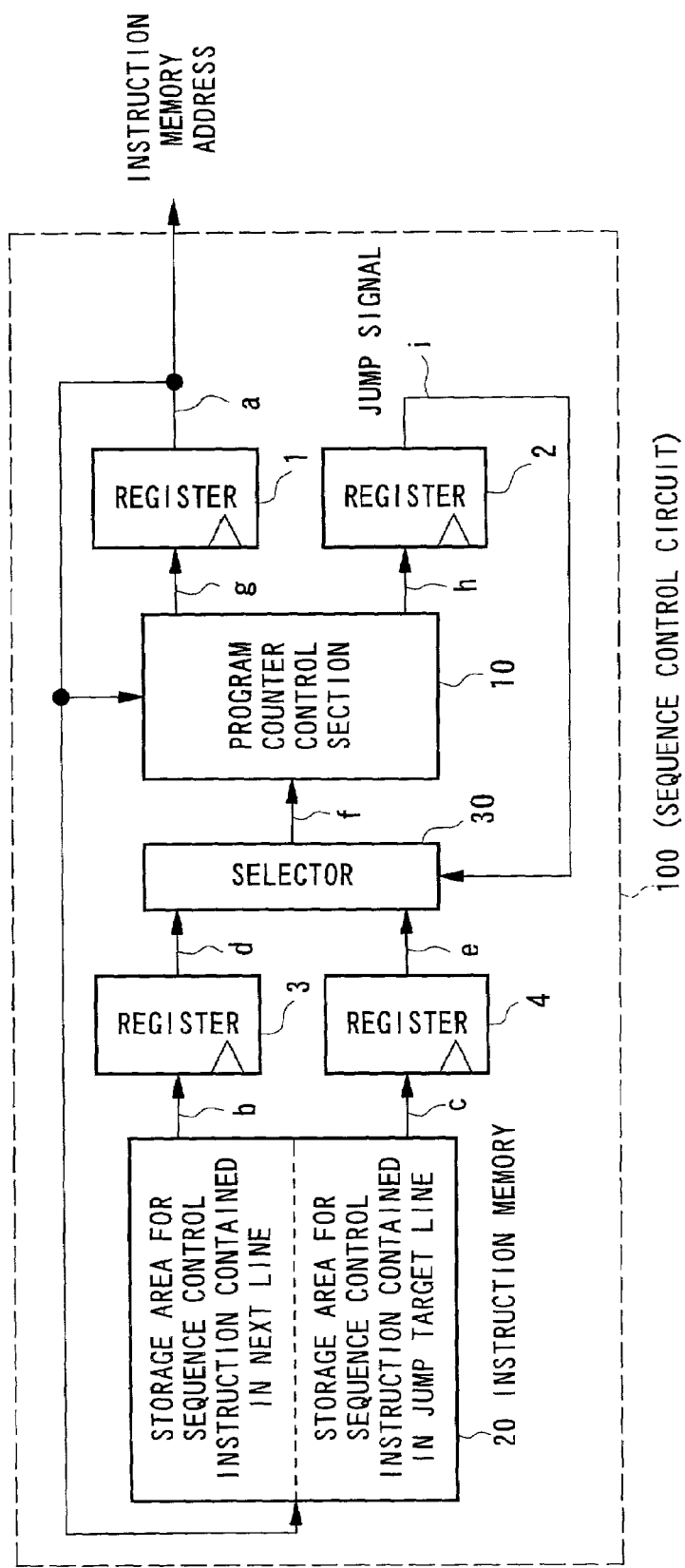
FIG. 1 is a block diagram showing the structure of a sequence control circuit in accordance with a first embodiment of the present invention.

FIG. 1 is a block diagram showing the structure of a sequence control circuit according to a first embodiment of the present invention. A sequence control circuit 100 is provided with a register 1 which outputs a program counter signal "a", an instruction memory 20 which stores sequence control instructions and is accessed by the register 1 in accordance with the program counter signal "a", registers 3 and 4 which receive and hold the outputs b and c sent from the instruction memory 20, respectively, a selector 30 which selects either one of the outputs from the registers 3 and 4 in accordance with a jump signal i, a program counter control section 10 which decodes a sequence control instruction f to determine a next program counter signal g and a next jump signal h (i.e. both of which will be used in the next clock cycle), and a register 2 which includes a jump flag (not shown in the figures) and outputs the value of the jump flag as the jump signal i.

The instruction memory 20 has two storage areas for each value of the program counter signal "a", a first storage area for storing a sequence control instruction described in the next line of the line designated by the program counter signal "a" in a test program, and a second storage area for storing a sequence control instruction described in the line of the jump target of the instruction that is contained in the line designated by the program counter signal "a". Prior to the start of a test, appropriate sequence control instructions are written into the first and second storage areas of the instruction memory 20 in accordance with a test program.

For instance, address "0" of the instruction memory 20 contains a sequence control instruction described in the next line of the top line in the test program and a sequence control instruction described in the line of the jump target designated by an instruction contained in the top line. However, if the execution of a sequence control instruction described in a line does not cause a jump operation, the second storage area corresponding to this line will not be initialized, so that the contents of which are indefinite.

Further, in order to initialize the registers 1, 2, and 3, the address corresponding to the top line is set in the register 1, a sequence control instruction described in the top line is set in the register 3, and the jump flag included in the register 2 is reset.

Next, the operation of the above-described sequence control circuit will be explained. When a test is started, the instruction memory 20 is accessed in accordance with the program counter signal "a", so that a sequence control instruction b stored in the next line and a sequence control instruction c stored in the line specified by the jump target are read out. The selector 30 selects an output e from the register 4 when the jump signal i from the register 2 indicates that the jump flag is set. Conversely, the selector 30 selects an output d from the register 3 when the jump signal i indicates that the jump flag is reset. The program counter control section 10 decodes the sequence control instruction f selected by the selector 30 to determine the next program counter signal g. When the contents of the program counter are updated as a result of a jump operation, the program counter control section 10 outputs a jump signal h to the register 2 in order to set the jump flag in the next clock cycle.

In the first clock cycle, the registers 1, 2, and 3 output their initial values, respectively, and the register 4 outputs indefinite data. Since the jump flag contained in the register 2 is initially reset, the selector 30 selects the sequence control instruction that is contained in the top line and is sent from the register 3. Next, the instruction memory 20 and the program counter control section 10 carry out an operation similar to the one stated above. That is to say, in the next clock cycle, the instruction memory 20 outputs the sequence control instructions b and c to the registers 3, 4, respectively, and the program counter control section 10 outputs the next program counter signal g and the next jump signal h to the registers 1 and 2, respectively. As a result, in the subsequent clock cycle, the registers 1, 2, 3, and 4 output the program counter signal "a", the jump signal i, the output d, and the output e, respectively. The sequence control circuit 100 repeats the above-described operations to output program counter signals "a" one after another.

Figures 2, 3:
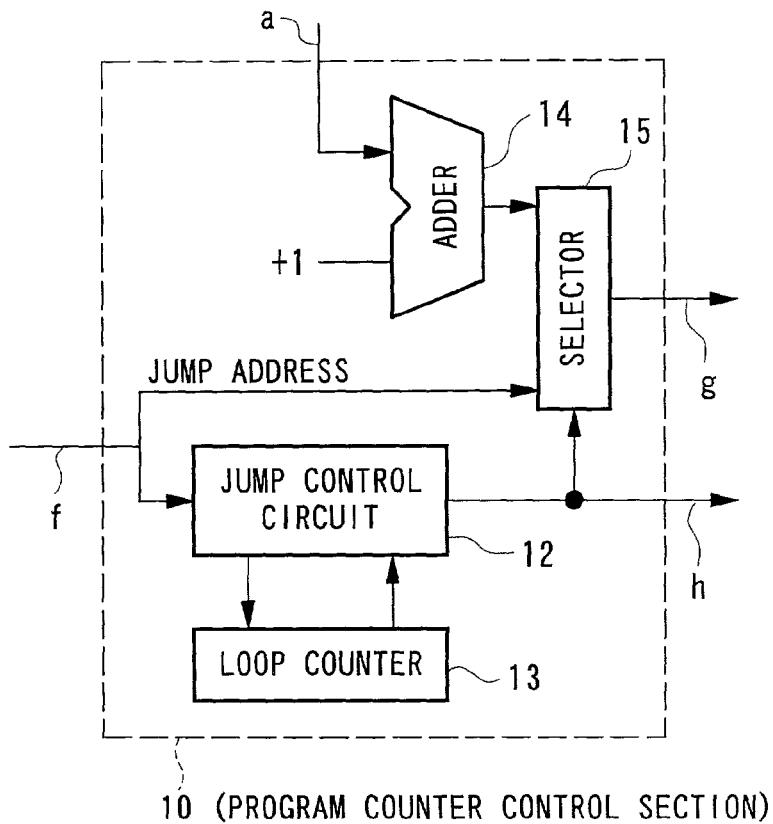
FIG. 2 is a block diagram showing an example of the structure of the program counter control section shown in FIG. 1.
FIG. 3 is an explanatory diagram showing an example of instructions stored in the instruction memory shown in FIG. 1.

FIG. 2 is a block diagram showing an example of the structure of the program counter control section 10.

This program counter control section 10 is provided with a jump control circuit 12 which controls the jump operation by updating the contents of the program counter, a loop counter 13 which counts the number of times of the execution of an instruction loop contained in the test program, an adder 14 which increases the value of the program counter signal "a" by "1", and a selector 15 which selects either the increased program counter signal from the adder 14 or a jump address included in the sequence control instruction f.

Next, the operation of the program counter control section 10 will be explained. Regardless of the instruction type of the sequence control instruction f, the adder 14 increases the value of the program counter signal "a" by "1".

When an NOOP instruction is sent from the selector 30 as the sequence control instruction f, the jump control circuit 12 determines that no jump operation will be performed, and outputs a jump signal h indicating that the NOOP instruction does not cause a jump operation. The selector 15 selects the output from the adder 14 in accordance with the jump signal h from the jump control circuit 12 indicating that the NOOP instruction does not cause a jump operation. As a result, the selector 15 outputs the increased program counter signal as the next program counter signal g.

On the other hand, when a LOOP instruction is sent from the selector 30 as the sequence control instruction f, the jump control circuit 12 directs the loop counter 13 to count the execution of an instruction loop until the loop is executed as many as the number of times specified by the LOOP instruction. Then, the jump control circuit 12 determines the completion of the entire count operation whenever the LOOP instruction is executed, and if the determination result shows that the entire count operation has not been completed, the jump control circuit 12 outputs a signal indicating that the LOOP instruction causes a jump operation as the jump signal h. Upon receipt of the signal from the jump control circuit 12 indicating that the LOOP instruction causes a jump operation, the selector 15 selects a jump address contained in the sequence control instruction f to output the jump address as the next program counter signal g. When the loop counter 13 has ended the entire count operation, the jump control circuit 12 outputs a signal indicating that the LOOP instruction does not cause a jump operation as the jump signal h. Subsequently, the jump control circuit 12 carries out similar operations as in the case where an NOOP instruction is executed.

Figure 4:
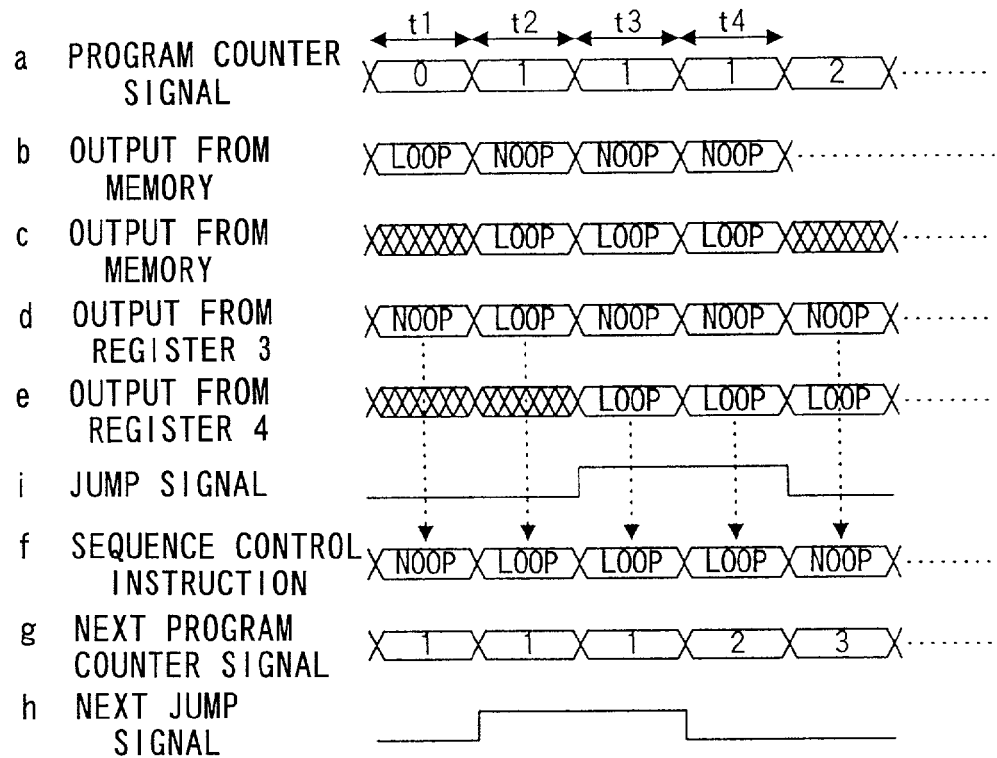
FIG. 4 is a timing chart to explain the operation of the sequence control circuit in accordance with the first embodiment of the present invention.

Next, the operation of the sequence control circuit 100 according to the present embodiment will be explained when the circuit 100 executes the test program shown in FIG. 7. Here, FIG. 3 shows sequence control instructions stored in the instruction memory 20. FIG. 4 shows the waveforms of various signals generated in the sequence control circuit 100 during the execution of the test program shown in FIG. 7.

In the instruction memory 20, a LOOP instruction is written into the first storage area of address "0", an NOOP instruction is written into the first storage area of address "1", and a LOOP instruction (exactly a "LOOP 3 AA" instruction) is written into the second storage area. Since the NOOP instruction described in the top line does not cause a jump operation, the contents of the second storage area of address "0" are indefinite. In order to initialize the registers 1, 2, and 3, the register 1 is set to "0", the jump flag contained in the register 2 is set to "0" in order that the register 2 outputs the low level as the jump signal i indicating that the sequence control instruction does not cause a jump operation, and the NOOP instruction described in the top line is set in the register 3.

When a test is started, in the first clock cycle t1, the register 1 outputs an initial value "0" as the program counter signal "a". The instruction memory 20 is accessed by the program counter signal "a" to output a LOOP instruction and indefinite data stored in address "0" as the sequence control instructions b and c, respectively. The register 3 outputs an NOOP instruction that has been initially set as an output d. The register 4 outputs indefinite data as the output e. The register 2 outputs low level as the jump signal i. The selector 30 selects the output d from the register 3 in accordance with the jump signal i to output an NOOP instruction as the sequence control instruction f. The program counter control section 10 decodes the NOOP instruction to output "1" obtained by increasing the value of the program counter signal by "1" as the next program counter signal g, and to output low level as the jump signal h indicating that the NOOP instruction does not cause a jump operation.

In the following clock cycle t2, the register 1 outputs "1" as the program counter signal "a". The instruction memory 20 outputs an NOOP instruction and a LOOP instruction stored in address "1" as the sequence control instructions b and c, respectively. The register 3 outputs a LOOP instruction as the output d, the register 4 outputs indefinite data as the output e, and the register 2 outputs low level as the jump signal i. The selector 30 selects the output from the register 3 based on the jump signal i to output a LOOP instruction as the sequence control instruction f.

In the program counter control section 10, the jump control circuit 12 directs the loop counter 13 to carry out one count operation in accordance with the LOOP instruction sent from the selector 30, and then determines the completion of the entire count operation based on the output from the loop counter 13. At this time, since the entire count operation has not been completed, the jump control circuit 12 determines that the LOOP instruction causes a jump operation and outputs high level as the jump signal h indicating that the execution of the LOOP instruction results in a jump operation. Then, the selector 15 selects the jump address to output its value "1" as the next program counter signal g.

In the following clock cycle t3, the register 1 outputs "1" as the program counter signal "a". The instruction memory 20 outputs an NOOP instruction and a LOOP instruction stored in address "1" as the sequence control instructions b and c, respectively. The register 3 outputs an NOOP instruction as the output d, the register 4 outputs a LOOP instruction as the output e, and the register 2 outputs high level as the jump signal i. Since the jump signal i is high level, the selector 30 selects the output from the register 4 to output a LOOP instruction as the sequence control instruction f.

The jump control circuit 12 directs the loop counter 13 to carry out one count operation in accordance with the LOOP instruction, and then determines the completion of the entire count operation based on the output from the loop counter 13. At this time, since the entire count operation has not yet been completed, the jump control circuit 12 determines that the LOOP instruction causes a jump operation and outputs high level as the jump signal h indicating that the execution of the LOOP instruction results in a jump operation. Then, the selector 15 selects the jump address and outputs its value "1" as the next program counter signal g.

In the following clock cycle t4, the register 1 outputs "1" as the program counter signal "a". The instruction memory 20 outputs an NOOP instruction and a LOOP instruction stored in the address "1" as the sequence control instructions b and c, respectively. The register 3 outputs an NOOP instruction as the output d, the register 4 outputs a LOOP instruction as the output e, and the register 2 outputs high level as the jump signal i. Since the jump signal i is high level, the selector 30 selects the output from the register 4 to output a LOOP instruction as the sequence control instruction f. The jump control circuit directs the loop counter 13 to carry out one count operation in accordance with the LOOP instruction, and then determines the completion of the entire count operation based on the output from the loop counter 13. At this time, the entire count operation has been completed because the count operations have been done three times, the jump control section 12 determines that the LOOP instruction does not cause a jump operation and outputs low level as the jump signal h indicating that the execution of the LOOP instruction does not result in a jump operation. Therefore, the selector 15 outputs "2" obtained by increasing the program counter signal "a" by "1" as the program counter signal g.

Figure 6:
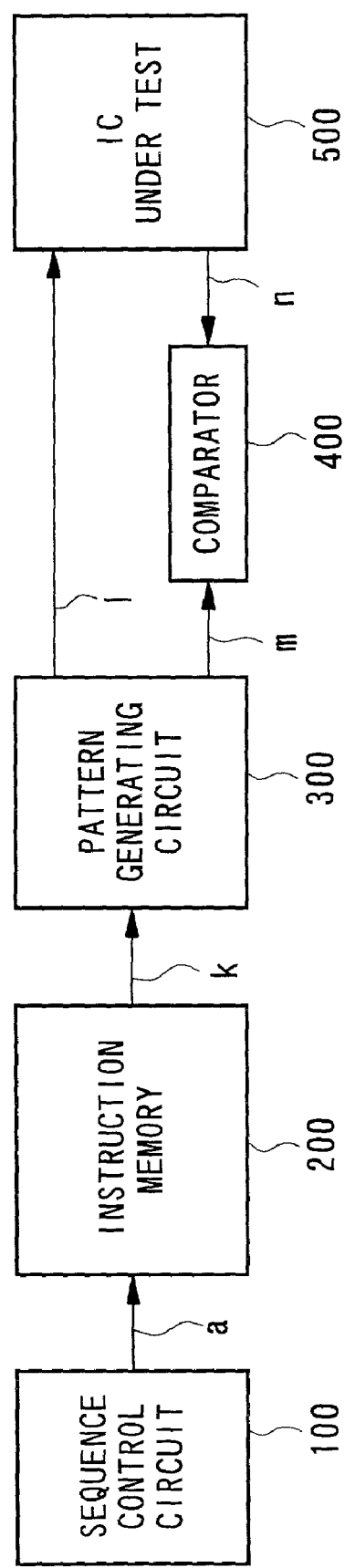
FIG. 6 is a block diagram showing the structure of a semiconductor testing apparatus.
Figures 9, 10:
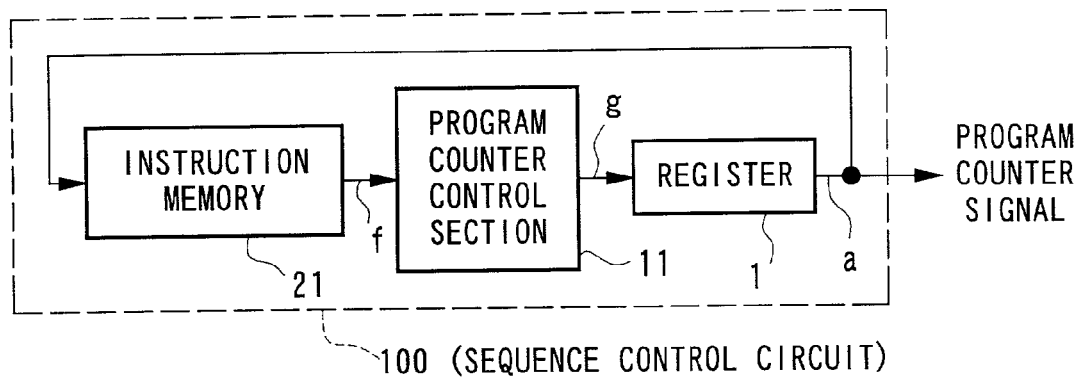
FIG. 9 is a block diagram showing the structure of a conventional sequence control circuit.
FIG. 10 is a timing chart to explain the operation of the conventional sequence control circuit.

By repeating the operations as stated above, the sequence control circuit 100 generates a sequence of "0", "1", "1", "1", and "2" as the program counter signals "a". The values of the program counter signal "a" are output as addresses supplied to the instruction memory 200 shown in FIG. 6.

Embodiment 2

Figure 5:
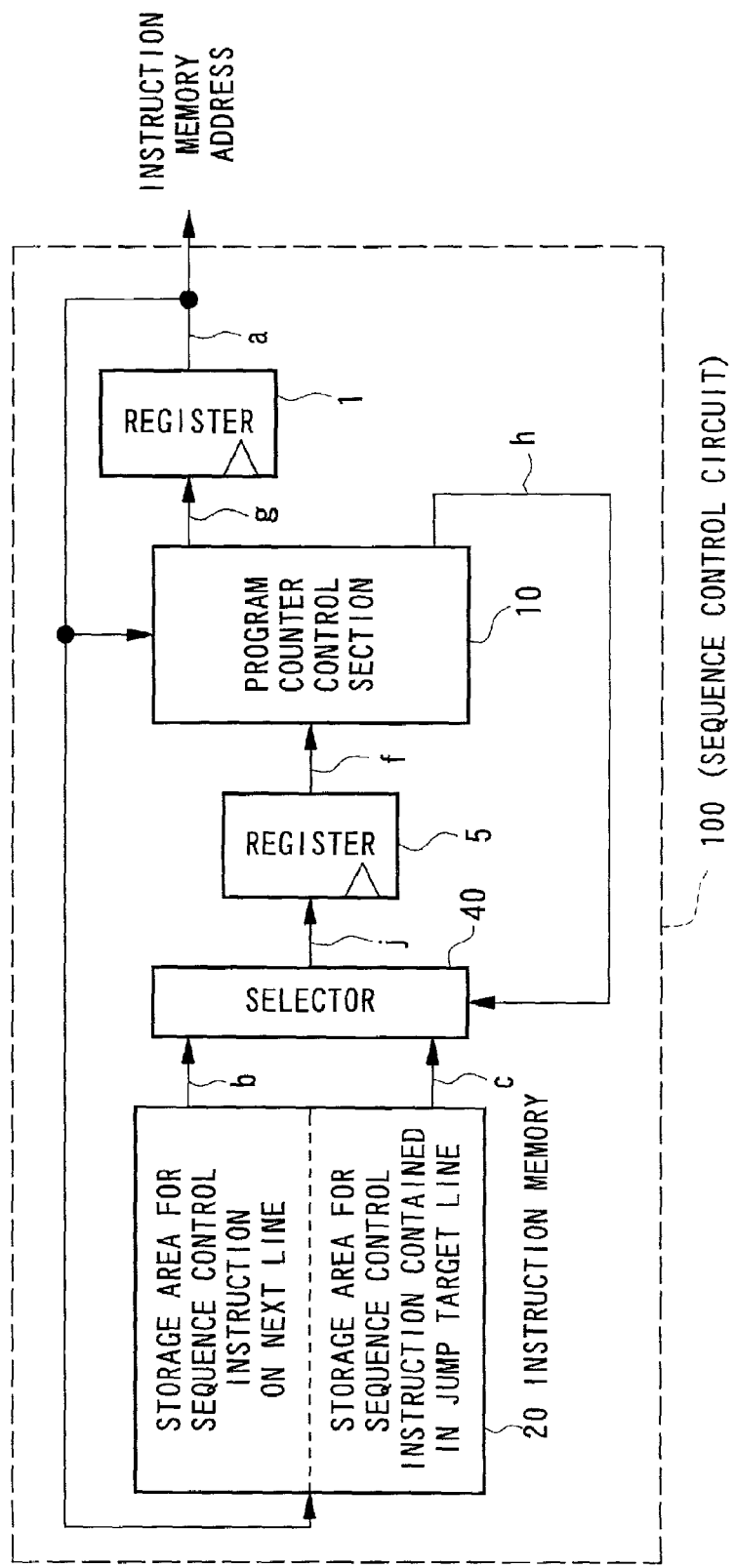
FIG. 5 is a block diagram showing the structure of a sequence control circuit in accordance with a second embodiment of the present invention.

FIG. 5 is a block diagram showing the structure of a sequence control circuit 100 according to a second embodiment of the present invention. This sequence control circuit 100 is provided with a register 1 which outputs a program counter signal "a", an instruction memory 20 which is accessed by the program counter signal "a" to output a sequence control instruction b described in the next line and a sequence control instruction c described in the line specified by the jump target, a selector 40 which selects either one of the sequence control instructions b and c in accordance with the jump signal h, a register 5 which receives a selected output j from the selector 40, and a program counter control section 10 which decodes the sequence control instruction from the register 5 to determine a next program counter signal g and a jump signal h.

In the present embodiment, a sequence control instruction, which is selected by the selector 30 in the first embodiment, is selected earlier by one clock cycle with respect to the first embodiment.

Next, the operation of the sequence control circuit according to the present embodiment will be explained.

Similar to the first embodiment, in the instruction memory 20, a sequence control instruction described in the next line of the line specified by the program counter signal "a" and a sequence control instruction described in the line of a jump target of the instruction that is contained in the line designated by the program counter signal "a" are written into the corresponding first and second storage areas for each value of the program counter signal "a" in advance of the start of a test.

Additionally, in order to initialize the registers 1 and 5, the address corresponding to the top line of a test program is set in the register 1, and the sequence control instruction described in the top line is set in the register 5.

When a test is started, in the first clock cycle, the register 1 outputs the address of the top line as the program counter signal "a". The instruction memory 20 is accessed by the program counter signal "a", so that a sequence control instruction b described in the next line of the top line and a sequence control instruction c described in the line of the jump target specified by the instruction of the top line are read out from the instruction memory 20. The register 5 outputs the sequence control instruction f described in the top line that has been set before the start of the test. The program counter control section 10 decodes the sequence control instruction f, which is described in the top line and is sent from the register 5, to determine the next program counter signal g. When the contents of the program counter are updated by a jump operation, the program counter control section 10 outputs high level as the jump signal h. If the jump signal h sent from the program counter control section 10 is low level, the selector 40 selects the sequence control instruction b described in the next line. Conversely, if the jump signal h is high level, the selector 40 selects the sequence control instruction c described in the line of the jump target.

In the next clock cycle, the register 1 outputs the next program counter signal g. The register 5 outputs the selected output j selected by the selector 40 in the previous clock cycle as the sequence control instruction f. As a result, processes similar to the one stated above will be carried out.

By repeatedly performing the series of operations described above, the sequence control circuit 100 generates the program counter signals "a" one after another as in the first embodiment.

What is claimed is:

1. A sequence control circuit comprising:
   a program counter control section which decodes, in an n-th clock cycle, a sequence control instruction that is executed in the n-th clock cycle, determines, in the n-th clock cycle, a program counter signal for specifying a sequence control instruction to be executed in an (n+1) th clock cycle, and outputs, in the (n+1)th cycle, the determined program counter signal as an instruction memory address; and
   an instruction memory section which reads, in the n-th cycle, said sequence control instruction to be executed in the (n+1)th clock cycle based on a program counter signal for specifying said sequence control instruction that is executed in the n-th clock cycle, and outputs, in the (n+1)th clock cycle, the read sequence control instruction to said program counter control section.

2. A sequence control circuit according to claim 1, wherein
   said instruction memory section is accessed by said instruction memory address sent from said program counter control section, and is provided with a first storage area for storing a first sequence control instruction contained in the next line of the line specified by said instruction memory address and a second storage area for storing a second sequence control instruction contained in the line of the jump target of the instruction specified by said instruction memory address for each value of said instruction memory address, and the circuit is further provided with a selector which selects either one of said first and second sequence control instructions that are read out from said instruction memory section in accordance with said instruction memory address, and said program counter control section outputs not only said instruction memory address but also a selection signal whose level is determined by whether said sequence control instruction selected by said selector causes a jump operation to said selector.

3. A sequence control circuit according to claim 2, wherein when the selected sequence control instruction causes a jump operation, said program counter control section outputs a selection signal for directing said selector to select said second sequence control instruction, or otherwise when the selected sequence control instruction does not cause a jump operation, said program counter control section outputs a selection signal for directing said selector to select said first sequence control instruction.

4. A sequence control circuit according to claim 2, wherein
said instruction memory section includes first and second registers which hold said first and second sequence control instructions that are read from said first and second storage areas, respectively, and
said selector selects either one of outputs from said first and second registers in accordance with said selection signal.

5. A sequence control circuit according to claim 2, wherein said program counter control section includes a third register which holds said program counter signal for specifying a sequence control instruction to be executed in the (n+1)th clock cycle, and a fourth register which holds said selection signal.

6. A sequence control circuit according to claim 2, wherein said instruction memory section includes a first register which holds the sequence control instruction selected by said selector to output that to said program counter control section.

7. A sequence control circuit according to claim 2, wherein said program counter control section includes a second register which holds said program counter control signal for specifying the sequence control instruction to be executed in said (n+1)th clock cycle, and directly outputs said selection signal to said selector.

8. A sequence control circuit according to claim 1, wherein the circuit is installed in a semiconductor testing apparatus which generates test patterns for testing a semiconductor device based on said instruction memory address.

9. A sequence control circuit according to claim 1, wherein the program counter signal has a value specifying a sequence control instruction to be executed.

10. A semiconductor testing apparatus comprising:
a pattern memory which stores pattern generating instructions for testing a semiconductor device;
a sequence control circuit which supplies an instruction memory address to said pattern memory in order to control the output sequence of the pattern generating instructions that are read out from said pattern memory;
a pattern generating circuit which generates test patterns supplied to said semiconductor device and expectation patterns in accordance with said pattern generating instructions that are output from said pattern memory; and
a determination circuit which determines the quality of said semiconductor device based on said expectation patterns and signals that are sent from said semiconductor device in accordance with said test patterns,
wherein said sequence control circuit comprising:
a program counter control section which decodes, in an n-th clock cycle, a sequence control instruction that is executed in the n-th clock cycle, determines, in the n-th clock cycle, a program counter signal for specifying a sequence control instruction to be executed in an (n+1)th clock cycle, and outputs, in the (n+1)th clock cycle, the determined program counter signal as said instruction memory address; and
an instruction memory section which reads, in the n-th cycle, said sequence control instruction to be executed in the (n+1)th clock cycle based on a program counter signal for specifying said sequence control instruction that is executed in the n-th clock cycle, and outputs, in the (n+1)th clock cycle, the read sequence control instructions to said program counter control section.

11. A semiconductor testing apparatus according to claim 10, wherein the program counter signal has a value specifying a sequence control instruction to be executed.

12. A method for operating a sequence control circuit including a program counter control section and instruction memory section, said method comprising:
receiving and decoding, at the program counter control section in an n-th clock cycle, a sequence control instruction that is executed in the n-th clock cycle;
determining, at the program counter control section in the n-th clock cycle, a program counter signal for specifying a sequence control instruction to be executed in an (n+1)th clock cycle;
outputting, from the program counter control section in the (n+1)th clock cycle, the determined program counter signal for the (n+1)th clock cycle as an instruction memory address;
reading, at the instruction memory section in the n-th clock cycle, the sequence control instruction to be executed in the (n+1)th clock cycle based on a program counter signal for specifying the sequence control instruction that is executed in the n-th clock cycle; and
outputting, from the instruction memory section in the (n+1)th clock cycle, the read sequence control instruction to the program counter control section.

13. A method according to claim 12, wherein the program counter signal has a value specifying a sequence control instruction to be executed.

* * * * *